US011025281B2

(12) United States Patent
Kifune et al.

(10) Patent No.: US 11,025,281 B2
(45) Date of Patent: Jun. 1, 2021

(54) MEMORY SYSTEM

(71) Applicant: KIOXIA CORPORATION, Tokyo (JP)

(72) Inventors: Naoko Kifune, Yokohama Kanagawa (JP); Hironori Uchikawa, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,322

(22) Filed: Mar. 2, 2020

(65) Prior Publication Data
US 2021/0091792 A1 Mar. 25, 2021

(30) Foreign Application Priority Data

Sep. 19, 2019 (JP) .............................. JP2019-170683

(51) Int. Cl.
*H03M 13/29* (2006.01)
*H03M 13/45* (2006.01)
*H03M 13/11* (2006.01)
*H03M 13/15* (2006.01)

(52) U.S. Cl.
CPC ....... *H03M 13/45* (2013.01); *H03M 13/1108* (2013.01); *H03M 13/1111* (2013.01); *H03M 13/1545* (2013.01); *H03M 13/1585* (2013.01); *H03M 13/2942* (2013.01)

(58) Field of Classification Search
CPC .......................... H03M 13/45; H03M 13/2942
See application file for complete search history.

(56) References Cited

U.S. PATENT DOCUMENTS

| 6,012,839 A * | 1/2000 | Nguyen | G06F 11/1004 714/755 |
| 8,495,465 B1 * | 7/2013 | Anholt | G06F 11/1012 714/763 |
| 2014/0053041 A1 * | 2/2014 | Sakaue | H03M 13/293 714/758 |

OTHER PUBLICATIONS

"Leveraging RAID for Soft BCH Decoding" by Eran Sharon, Ishai Ilani, Ilan Alrod, Non-Voltile Memories Workshop, pp. 1-2, 2019.
"A Case for Redundant Arrays of Inexpensive Disks (RAID)" David A Patterson, Garth Gibson, and Randy H Katz, International Conference on Management of Data(SIGMOD), pp. 109-116, Jun. 1988.

* cited by examiner

*Primary Examiner* — Joseph D Torres
(74) *Attorney, Agent, or Firm* — Kim & Stewart LLP

(57) ABSTRACT

A memory system includes a nonvolatile memory and a memory controller that encodes first XOR data generated by performing an exclusive OR operation on pieces of user data, wherein a value of each bit of the XOR data is generated by performing an exclusive OR operation on values of bits that are at one of a plurality of bit positions of a piece of user data, generates codewords by encoding the plurality of pieces of user data and the generated XOR data, respectively, and stores the codewords in the nonvolatile memory. The memory controller also performs a read operation by reading the codewords from the nonvolatile memory and decoding them. When the decoding of two or more of the codewords fails, the memory controller generates second XOR data, and corrects the value of one of the bits corresponding to a codeword whose decoding failed, based on the second XOR data.

6 Claims, 9 Drawing Sheets

MEMORY SYSTEM

CROSS-REFERENCE TO RELATED APPLICATION

This application is based upon and claims the benefit of priority from Japanese Patent Application No. 2019-170683, filed, Sep. 19, 2019, the entire contents of which are incorporated herein by reference.

FIELD

Embodiments described herein relate generally to a memory system.

BACKGROUND

Generally, in order to protect data to be stored in a memory system, data subjected to error correction coding is stored. Therefore, when the data stored in the memory system is read, decoding is performed on the data subjected to the error correction coding.

DETAILED DESCRIPTION

Embodiments provide a memory system capable of performing error correction with higher accuracy.

In general, according to one embodiment, a memory system of the embodiment includes a nonvolatile memory and a memory controller. The memory controller is configured to: encode first XOR data generated by performing an exclusive OR operation on a plurality of pieces of user data in bit units, wherein a value of each bit of the XOR data is generated by performing an exclusive OR operation on values of bits that are at one of a plurality of bit positions of a piece of user data, generate codewords by encoding the plurality of pieces of user data and the generated XOR data, respectively, and store the plurality of codewords in the nonvolatile memory; and perform a read operation by reading the plurality of codewords from the nonvolatile memory as a plurality of received words and decoding the received words. When the decoding of two or more of the received words fails, the memory controller generates second XOR data, wherein a value of each bit of the second XOR data is an exclusive OR of values of bits of decoded codewords, which were successfully decoded from the received words, and received words, which were not successfully decoded into decoded codewords, at one of a plurality of bit positions of the decoded codeword or the received word. When a value of a bit of the second XOR data indicates a probability of an error in one of the values of the bits from which the value of the bit was generated, the memory controller corrects the value of one of the bits corresponding to one of the received words whose decoding failed, and decodes the received word that has been corrected.

Hereinafter, a memory system according to embodiments will be described in detail with reference to the accompanying drawings. It should be noted that the present disclosure is not limited by the following embodiments.

First Embodiment

Figure 1:
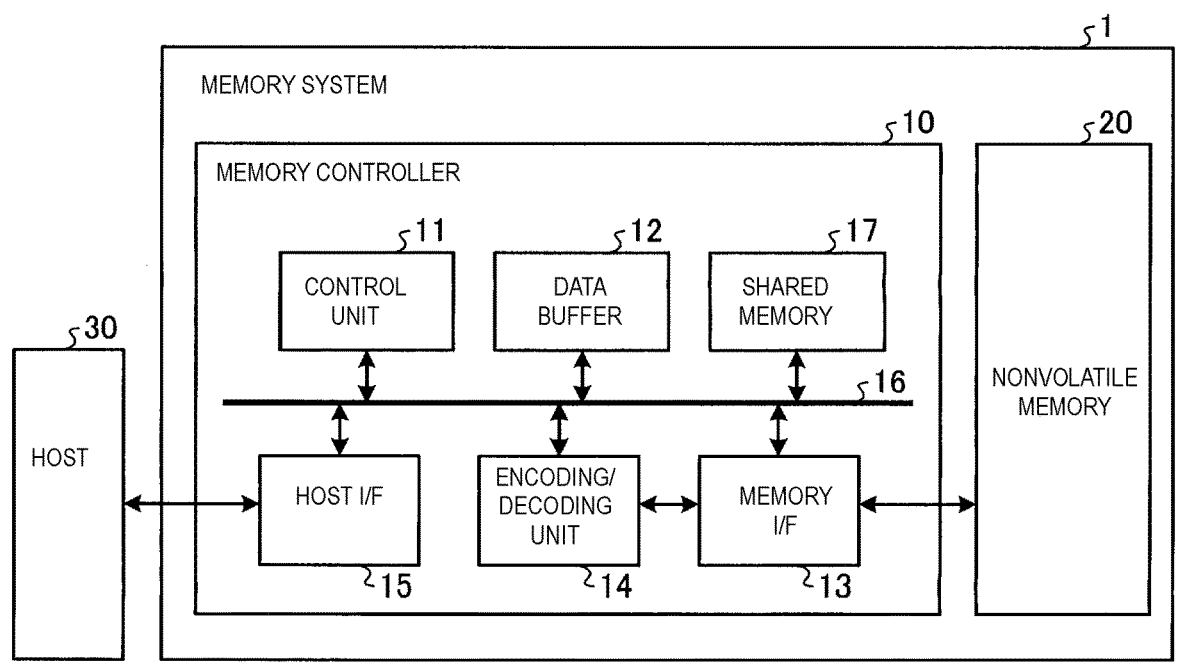
FIG. 1 is a block diagram showing a configuration example of a memory system according to a first embodiment.

FIG. 1 is a block diagram showing a configuration example of a memory system according to the first embodiment. As shown in FIG. 1, a memory system 1 includes a memory controller 10 and a nonvolatile memory 20. The memory system 1 can be connected to a host 30, and FIG. 1 shows a state where the memory system 1 is connected to the host 30. The host 30, for example, may be an electronic device such as a personal computer or a mobile terminal.

The nonvolatile memory 20 is a nonvolatile memory that stores data in a nonvolatile manner, and is, for example, a NAND flash memory (hereinafter simply referred to as NAND memory). In the following description, a case where the NAND memory is used as the nonvolatile memory 20 will be given as an example. However, the nonvolatile memory 20 may be a storage device other than NAND memory, such as a three-dimensional structure flash memory, a resistance random access memory (ReRAM), or a ferroelectric random access memory (FeRAM). In addition, the nonvolatile memory 20 may not necessarily be a semiconductor memory, and the present embodiment may be applied to various storage media other than a semiconductor memory.

The memory system 1 may be a memory card or the like in which the memory controller 10 and the nonvolatile memory 20 are contained in one package, or may be a solid state drive (SSD) or the like.

The memory controller 10 is a semiconductor integrated circuit, for example, a system-on-a-chip (SoC). A part or all of operations of each component of the memory controller described below may be implemented by a central processing unit (CPU) executing firmware, or may be implemented by hardware.

The memory controller 10 controls writing to the nonvolatile memory 20 in accordance with a write request from the host 30. In addition, the memory controller 10 controls reading from the nonvolatile memory 20 in accordance with a read request from the host 30. The memory controller 10 includes a host interface (host I/F) 15, a memory interface (memory I/F) 13, a control unit 11, an encoding/decoding unit (codec) 14, a data buffer 12, and a shared memory 17. The host I/F 15, the memory I/F 13, the control unit 11, the encoding/decoding unit 14, the data buffer 12, and the shared memory 17 are connected to one another by an internal bus 16.

The host I/F 15 performs a process according to an interface standard with the host 30 and outputs a request, user data to be written, and the like received from the host 30 to the internal bus 16. In addition, the host I/F 15 transmits user data read from the nonvolatile memory 20, a response from the control unit 11, and the like to the host 30.

The memory I/F 13 performs a write operation for the nonvolatile memory 20 based on an instruction of the control unit 11. In addition, the memory I/F 13 performs a read process from the nonvolatile memory 20 based on the instruction of the control unit 11.

The data buffer 12 temporarily stores the user data received from the host 30 by the memory controller 10 until the user data is stored in the nonvolatile memory 20. In addition, the data buffer 12 temporarily stores the user data read from the nonvolatile memory 20 until the user data is transmitted to the host 30. The data buffer 12 may be a general purpose memory such as a static random access memory (SRAM) or a dynamic random access memory (DRAM).

The control unit 11 controls each element of the memory system 1. When receiving the request from the host 30 via the host I/F 15, the control unit 11 performs control according to the request. For example, the control unit 11 instructs the memory I/F 13 to write the user data and parity to the nonvolatile memory 20 in response to the write request from the host 30. In addition, the control unit 11 instructs the memory I/F 13 to read the user data and the parity from the nonvolatile memory 20 in response to the read request from the host 30.

When receiving the write request of the user data from the host 30, the control unit 11 determines a storage area in the nonvolatile memory 20 for the user data stored in the data buffer 12. That is, the control unit 11 manages a write destination of the user data. The correspondence between a logical address of the user data received from the host 30 and a physical address indicating the storage area in the nonvolatile memory 20 in which the user data is stored, is stored in, for example, the data buffer 12 as an address conversion table.

In addition, when receiving the read request from the host 30, the control unit 11 converts the logical address specified by the read request into the physical address using the above-described address conversion table, and instructs the memory I/F 13 to read from the physical address.

Herein, in the NAND memory, the writing and the reading are generally performed in a data unit called a page, and erasing is performed in a data unit called a block. In the present embodiment, a plurality of memory cells connected to the same word line are referred to as a memory cell group. When the memory cell is a single level cell (SLC), one memory cell group corresponds to one page. When the memory cell is a multi-level cell (MLC), one memory cell group corresponds to a plurality of pages. In addition, each memory cell is connected to the word line and is connected to a bit line. Therefore, each memory cell can be identified by an address for identifying the word line and an address for identifying the bit line.

For example, when the memory cell is a 2-bit/cell memory cell, 2-bit data values are associated with four threshold voltage distributions of Er, A, B, and C states, respectively. This correspondence is called data coding. The data coding is predetermined. At the time of data writing (also referred to as programming), electric charges are injected into the memory cell so as to achieve a state corresponding to the data value stored according to the data coding. In addition, when the 2-bit/cell memory cell is used, one memory cell group corresponds to 2 pages. The 2 bits that can be stored in each memory cell correspond to the two pages.

The user data transmitted from the host 30 is transferred to the internal bus 16 and temporarily stored in the data buffer 12. The encoding/decoding unit 14 encodes the user data stored in the nonvolatile memory 20 to generate encoded data (also referred to as a codeword). In addition, the encoding/decoding unit 14 decodes the encoded data (also referred to as read information or received word) read from the nonvolatile memory 20 to restore the user data. It should be noted that the data encoded by the encoding/decoding unit 14 may include control data used by the memory controller 10 in addition to the user data.

In the write operation in the memory system 1 including the above configuration, the control unit 11 instructs the encoding/decoding unit 14 to encode the user data when writing to the nonvolatile memory 20. At this time, the control unit 11 determines a storage location (e.g., storage address) of the codeword in the nonvolatile memory 20 and instructs the memory I/F 13 also about the determined storage location. The encoding/decoding unit 14 encodes the user data stored in the data buffer 12 based on the instruction from the control unit 11 to generate the codeword. As an encoding method, for example, an encoding method using a low-density parity-check (LDPC) code, a Bose-Chaudhuri-Hocquenghem (BCH) code, or a Reed-Solomon (RS) code may be used.

On the other hand, in a read operation, the control unit 11 designates an address in the nonvolatile memory 20 and instructs the memory I/F 13 to read when reading from the nonvolatile memory 20. In addition, the control unit instructs the encoding/decoding unit 14 to start the decoding. The memory I/F 13 performs the reading from a specified address in the nonvolatile memory 20 in accordance with the instruction from the control unit 11, and inputs the read information obtained by the reading to the encoding/decoding unit 14. Then, the encoding/decoding unit 14 decodes the input read information.

In the read operation of data from the nonvolatile memory 20, hard bit decision read (also referred to as hard bit (HB) read) and soft bit decision read (also referred to as soft bit (SB) read) are performed.

In the hard bit decision read, hard bit decision value data (also referred to as hard bit (HB) data), which is binary data, is read by applying a read voltage (hereafter referred to as HB read level) at which a read bit value switches between (0, 1) to each memory cell. In the soft bit decision read, soft bit decision value data (also referred to as soft bit (SB) data) is further read by applying, to each memory cell, a plurality of read levels (hereinafter referred to as SB read levels) obtained by shifting a voltage value from the HB read level to a value that is lower by a certain value and a value that is higher by a certain value.

The SB data read from each memory cell by the SB read indicates how much a threshold voltage of each memory cell deviates from an assumed (0, 1) state. The SB data can be converted into a log likelihood ratio (LLR) representing the reliability of the bit value (or correctness of the value) read from each memory cell. For example, an LLR value is obtained based on the read HB data and SB data by using an LLR table in which LLRs including different values for each combination of HB data and SB data are used.

Figure 2:
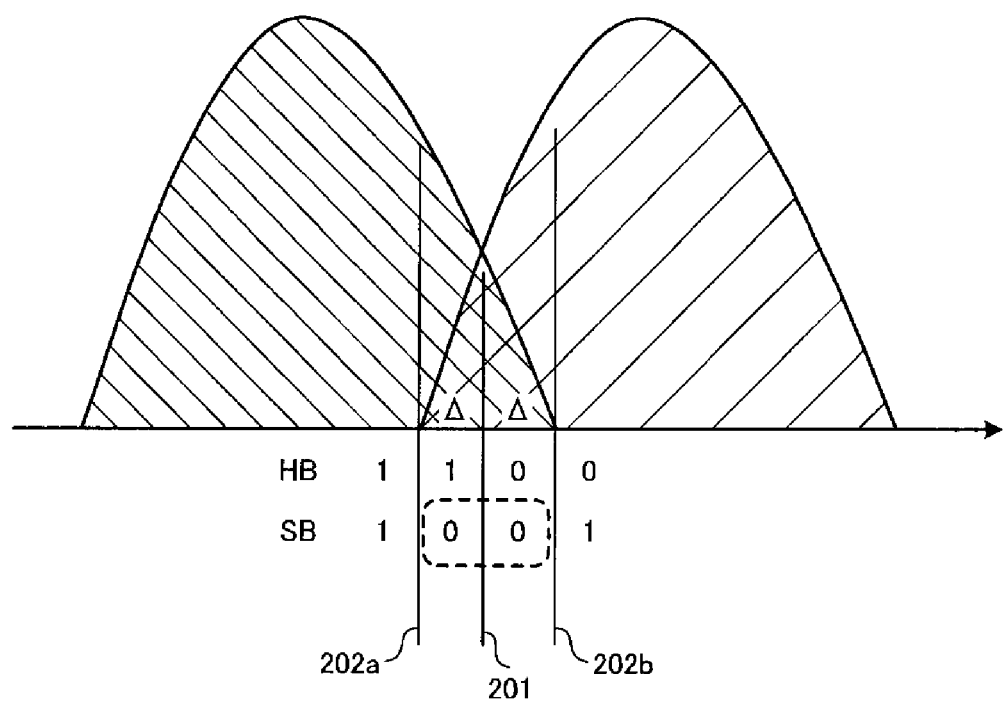
FIG. 2 is a diagram showing an example of a relationship between a threshold voltage distribution, data from a hard bit decision read (HB data), and data from a soft bit decision read (SB data).

The number of the voltage values shifted for the SB data read is not limited to 1 and may be 2 or more. FIG. 2 is a diagram showing an example of a relationship between a threshold voltage distribution, HB data, and SB data when the number of the voltage values shifted is one. Hereinafter, the HB data and the SB data may be expressed as HB and SB, respectively.

For example, a voltage 201 corresponding to a lowest point of a valley formed by overlapping the lower parts of a distribution corresponding to the bit value "1" and a distribution corresponding to the bit value "0" is set as the HB read level. A voltage 202a lower than the voltage 201 and a voltage 202b higher than the voltage 201 are set as SB read levels. Areas Δ in FIG. 2 are areas in the threshold voltage distribution in which the threshold voltage is between the voltage 201 and voltages shifted from the voltage 201 by a certain amount. The areas Δ can be interpreted as areas where the reliability of the read bit value is low.

Figure 3:
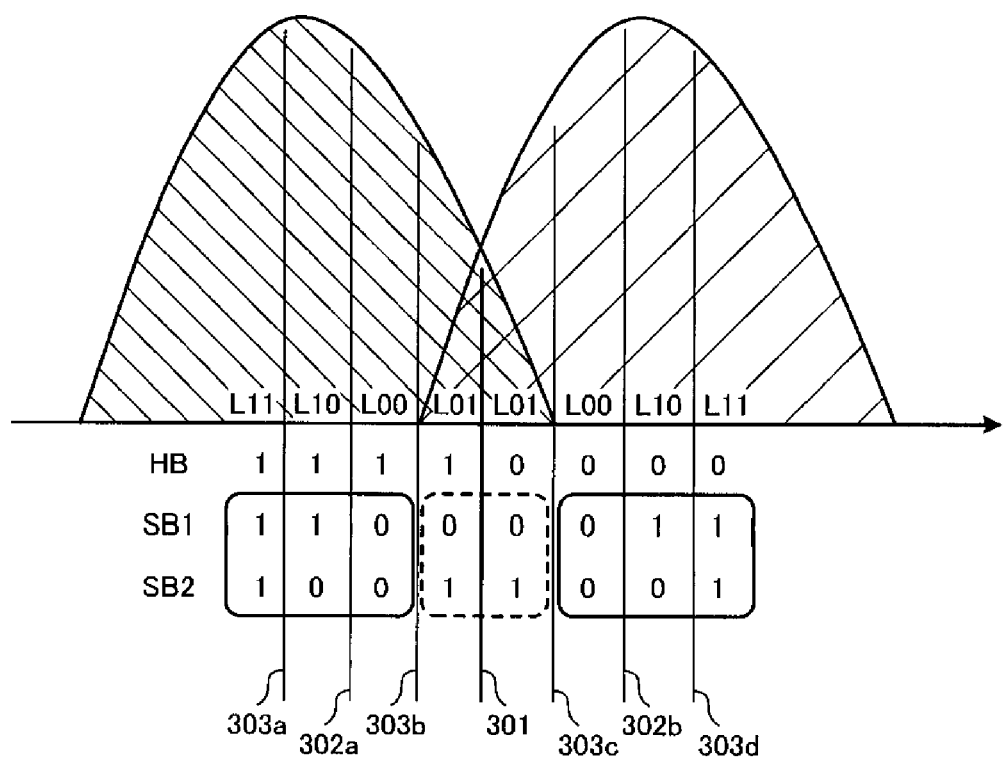
FIG. 3 is a diagram showing another example of a relationship between a threshold voltage distribution, HB data, and SB data.

FIG. 3 is a diagram showing an example of a relationship between a threshold voltage distribution, HB data, and SB data when the number of the voltage values shifted is three. In the example of FIG. 3, first, the HB read is performed with a voltage 301 as the HB read level. Thereafter, an SB read with a voltage 302a as the SB read level and an SB read with a voltage 302b as the SB read level are sequentially performed. Thereafter, SB reads are further sequentially performed with the voltages 303a, 303b, 303c, and 303d as the SB read level. In each SB read, the obtained bit values are ORed or ANDed. Accordingly, 2-bit SB data (SB1, SB2) is obtained.

Areas L01, L00, L10, and L11 are defined as follows according to the combination of the values of SB1 and SB2. It can be interpreted that the reliability of the read bit value increases in the order of the areas L01, L00, L10, and L11.
Area L01: SB1=0, SB2=1
Area L00: SB1=0, SB2=0
Area L10: SB1=1, SB2=0
Area L11: SB1=1, SB2=1

The encoding/decoding unit 14 decodes the encoded data read from the nonvolatile memory 20 by hard bit decision decoding (also referred to as hard bit decoding) or soft bit decision decoding (also referred to as soft bit decoding). The hard bit decision decoding is a decoding method of using only the HB data (hard bit decision values) as an input, correcting an error using an error correction code (ECC parity), and outputting a 1-bit binary data of "0" or "1". The soft bit decision decoding is a decoding method of using the HB data (hard bit decision values) and the SB data (soft bit decision values) as inputs. In addition, in the soft bit decision decoding, for example, determination is performed based on a probability of each decoded bit of being "0" (posterior value hard bit decision), and 1-bit binary data of "0" or "1" is output.

The memory controller 10 according to the present embodiment further has a function of adding redundant data generated by an XOR method (employing XOR parity) and distributing and storing the data in a plurality of different storage areas.

For example, when one memory cell group is used as one storage area, the memory controller 10 distributes and stores the data in N storage areas corresponding to N (N is an integer equal to or bigger than 2) word lines. In this case, the memory controller 10 may include N memory I/Fs 13 and N encoding/decoding units 14 respectively corresponding to the N word lines.

Figure 4:
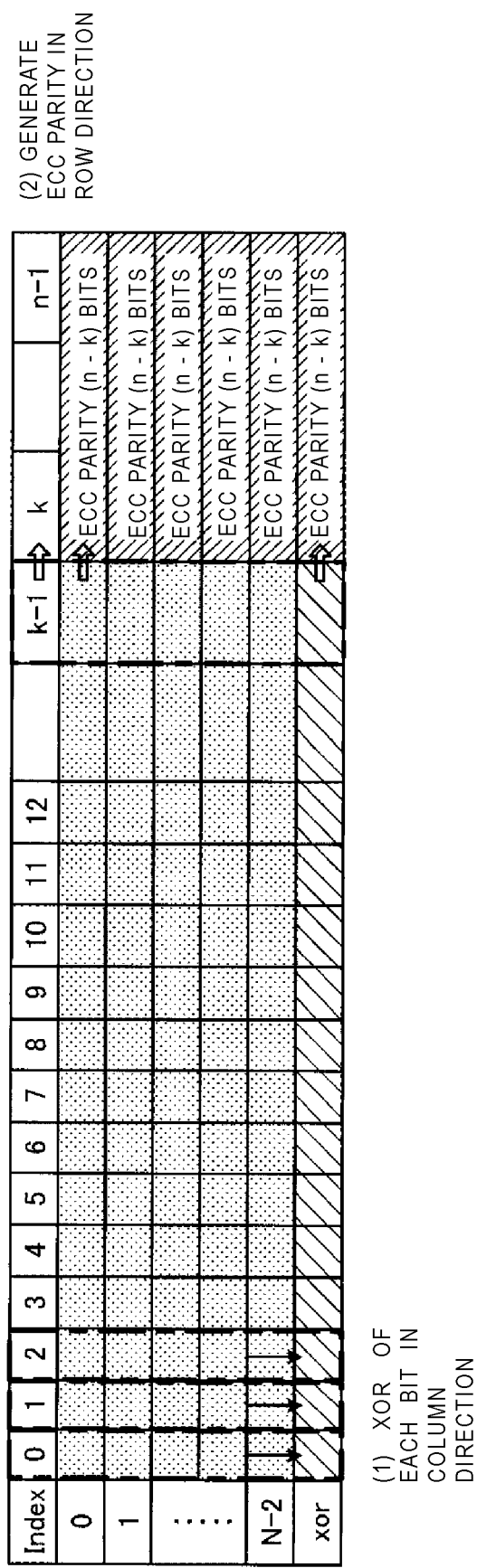
FIG. 4 is a diagram showing a configuration example of a code that includes XOR parity.

FIG. 4 is a diagram showing a configuration example of a code that includes XOR parity. The 0 to (n−1) bits of data in a horizontal direction correspond to data to be stored in one storage area corresponding to one word line. The data includes 0 to (k−1) bits of user data and (n−k) bits of an error correction code (e.g., ECC parity) generated from the user data.

The user data to be stored in each storage area is protected by the ECC parity generated using the user data. The user data to be stored in each storage area is made up a plurality of pieces of first data to be stored. For example, each of the 0 to (k−1) bits corresponds to one of the plurality of pieces of first data.

Hereinafter, the ECC parity for protecting the user data to be stored in each storage area may be called an intra-area code. In addition, error correction using the intra-area code may be referred to as intra-area error correction. The intra-area code is, for example, an algebraic code such as a BCH code or an RS code, a code based on sparse graph such as LDPC codes, or a product code and a concatenated code thereof.

As shown in FIG. 4, in the present embodiment, data including the user data and the ECC parity generated from the user data is stored in each of (N−1) storage areas indicated by indexes "0" to "N−2". Then, data including the XOR parity and the ECC parity generated from the XOR parity is stored in the N-th storage area indicated by an index "xor".

The XOR parity is generated by carrying out an exclusive OR (XOR) operation on the plurality of pieces of data selected one by one from each of the user data to be stored in the (N−1) storage areas. For example, as shown in FIG. 4, one bit at the same position is selected from each of the user data to be stored in the (N−1) storage areas, and the XOR parity is generated by calculating the XOR of the selected (N−1) bits.

When any one of the N storage areas is defective, the data stored in the defective storage area can be restored by the XOR parity. Such a configuration may be referred to as redundant arrays of inexpensive disks (RAID) configuration.

The memory controller 10 may be configured such that for example, the control unit 11 includes a function of generating the XOR parity and a function of restoring the data using the XOR parity. The memory controller 10 may include a control unit different from the control unit 11 that performs the functions.

In the write operation of the user data, the control unit 11 first generates the XOR parity by calculating the XOR of the data having the same bit position in each storage area among the user data to be stored in the (N−1) storage areas. Thereafter, the control unit 11 instructs the encoding/decoding unit 14 to encode the user data stored in the (N−1) storage areas indicated by the indexes "0" to "N−2" and the user data stored in the Nth storage area indicated by the index "xor".

When the decoding of the data read from one storage area in the read operation fails, the control unit 11 restores the data in a storage area where the decoding fails using the XOR parity. For example, the control unit 11 restores the data in the storage area where the decoding fails by calculating the XOR of the corresponding bit of the decoded data which have been received word read from the (N−1) storage areas other than the storage area where the decoding fails among the N storage areas including the storage area of the index "xor".

The memory controller 10 (in particular, the control unit 11) of the present embodiment further includes a function of correcting the received word read from the storage area where the decoding fails and performing the decoding again when the decoding of d ($2 \leq d \leq N$) storage areas fails. Hereinafter, the function will be described.

First, terms used for the description will be defined as follows.

$BER_{ave}$: Average of bit error rate (BER)
$BER_{high}$: BER of areas Δ
$BER_{low}$: BER of areas other than areas Δ
$P_{xor}(d)$: probability that N bits including d bits that may be an error d bits of XOR is 1 (probability that a number of errors in the d bits is an odd number)
$p(x_i)$: probability that an i-th ($1 \leq i \leq d$) bit $x_i$ is an error
$BER_{L01}$: BER of areas L01
$BER_{L00}$: BER of areas L00
$BER_{L10}$: BER of areas L10
$BER_{L11}$: BER of areas L11

Considering that the reliability of the bit values read in the order of the areas L01, L00, L10, and L11 increases, the magnitude relationship of each BER is $BER_{L01} > BER_{L00} > BER_{L10} > BER_{L11}$. Similarly, when the SB data is 1 bit, the magnitude relationship of each BER is $BER_{high} > BER_{low}$.

N bits ($d \leq N$) of XOR including d bits that may be an error are calculated, and a probability that the i-th bit $x_i$ when the calculated XOR is 1 is an error is expressed by the following Equation (1).

$$P(x_i = \text{error}|XOR=1) =$$

$$P(XOR=1|x_i=\text{error}) \times p(x_i)/P_{xor}(d) \qquad (1)$$

Since the $P(XOR=1|x_i=\text{error})$ is the probability that XOR=1 when the $x_i$ is an error, that is, probability that a number of errors in the (d−1) bits is an even number, $P(XOR=1|x_i=\text{error})$ can be expressed as $1-P_{xor}(d-1)$. When substituting this into Equation (1), the following Equation (2) is obtained.

$$P(x_i = \text{error}|XOR=1) =$$

$$(1 - P_{xor}(d-1)) \times p(x_i)/P_{xor}(d) \qquad (2)$$

In addition, the $P_{xor}(d)$ can be rewritten as the following Equation (3) using mathematical induction.

$$P_{xor}(d) = \tfrac{1}{2} - (1 - 2p(x_i))^d/2 \approx d \times BER \qquad (3)$$

Figure 5:
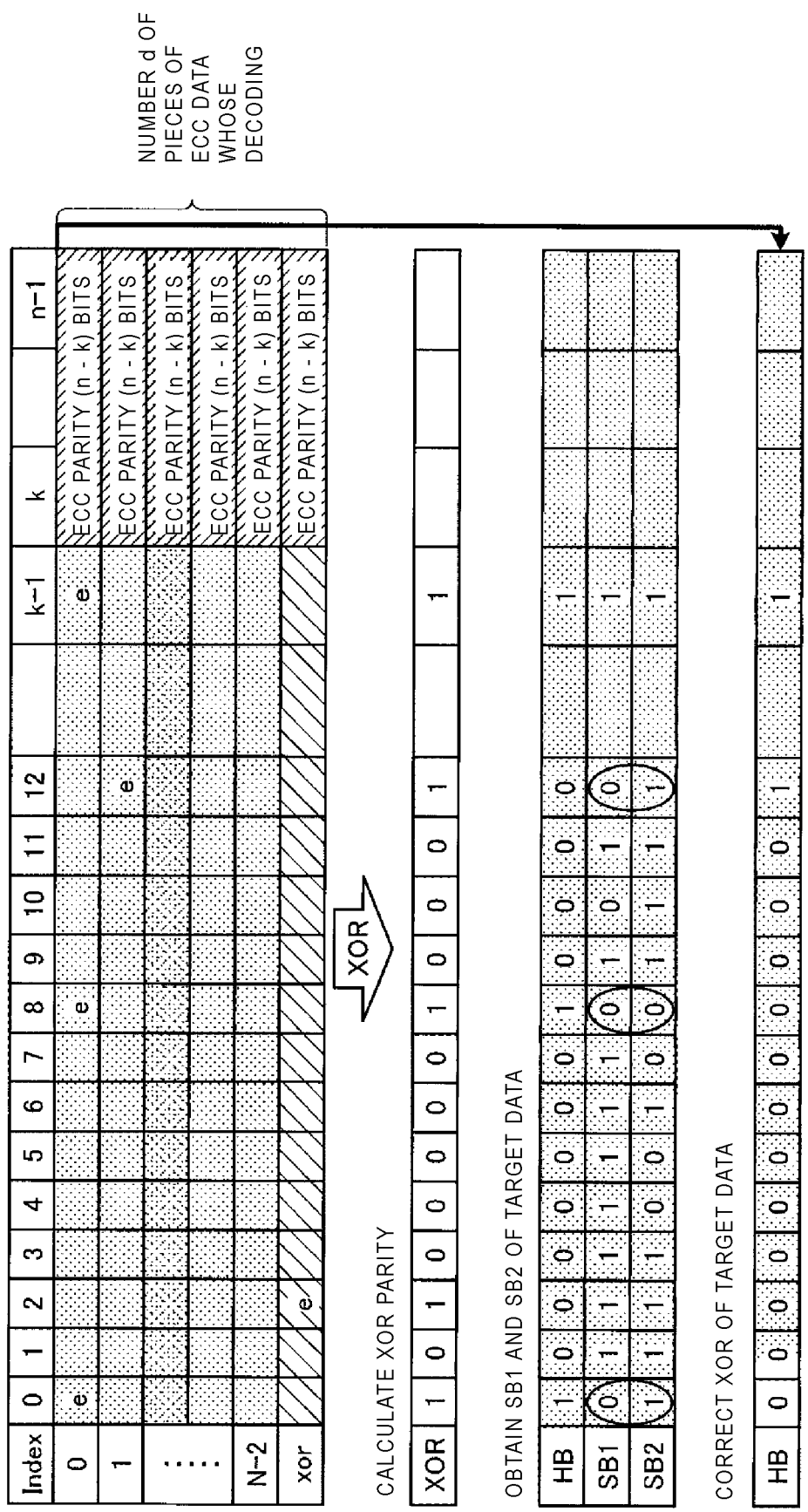
FIG. 5 is a diagram showing an example of a received word correction method according to the first embodiment.

FIG. 5 is a diagram showing an example of a received word correction method when the decoding of two or more storage areas fails. FIG. 5 shows an example when the SB data is 2 bits (SB1, SB2), whereas a similar correction method can be applied when the SB data is 1 bit or 3 bits or more. Bits marked with a symbol "e" in the drawing represent bits in which an error occurs.

It is assumed that the decoding fails in d ($2 \leq d \leq N$) different storage areas as a result of performing N times of intra-area error correction. First, the control unit 11 calculates an XOR for each bit using the N pieces of data including d received words whose intra-area error correction fails and (N−d) pieces of decoded data whose intra-area error correction succeeds. The decoded data may also be used for d areas where the intra-area error correction fails. This is because the number of decoding failures may decrease when the decoded data is used. FIG. 5 shows an example in which the XOR is 1 for 0th, 2nd, 8th, 12th and (k−1)-th bits. The XOR being 1 means that an odd number of received words in which an error occurs are present in the d received words (or the d pieces of decoded data) that may include an error that are included in the N pieces of data. It should be noted that for each bit, the XOR is 0 when an error occurs in an even number of storage areas.

The probability that a bit that is stored in the i-th storage area among the d storage areas where the decoding fails and whose XOR is 1 is an error is expressed by Equation (2).

When the SB data is 1 bit, it can be known whether the data stored in the i-th storage area is in the areas Δ or outside the areas Δ by using the SB data of the data stored in the i-th storage area. Herein, the probability that a bit in the areas Δ is an error will be considered. Equation (2) can be rewritten as the following Equations (4) and (5) when Equation (3) is used.

$$P(x_i = \text{error}|XOR=1) =$$

$$(1 - (d-1) \times BER_{ave}) \times BER_{high}/(d \times BER_{ave}) \qquad (4)$$

$$P(x_i = \text{error}|XOR=1) =$$

$$(1 - (d-1) \times BER_{ave}) \times BER_{low}/(d \times BER_{ave}) \qquad (5)$$

Equation (4) represents the probability that the bit $x_i$ is an error when xor is 1 and the bit $x_i$ is in the areas Δ. Equation (5) represents the probability that the bit $x_i$ is an error when xor is 1 and the bit $x_i$ is outside the areas Δ.

When the SB data is 2 bits, by using the SB data (SB1, SB2) of the data stored in the i-th storage area, it can be known in which of the areas L01, L00, L10, and L11 the data stored in the i-th storage area is. The probability that a bit is an error in each area can be expressed by the following Equations (6) to (9).

When the bit $x_i$ is in the areas L01:

$$P(x_i = \text{error}|XOR=1) =$$

$$(1 - (d-1) \times BER_{ave}) \times BER_{L01}/(d \times BER_{ave}) \qquad (6)$$

When the bit $x_i$ is in the areas L00:

$$P(x_i = \text{error}|XOR=1) =$$

$$(1 - (d-1) \times BER_{ave}) \times BER_{L00}/(d \times BER_{ave}) \qquad (7)$$

When the bit $x_i$ is in the areas L10:

$$P(x_i = \text{error}|XOR=1) =$$

$$(1 - (d-1) \times BER_{ave}) \times BER_{L10}/(d \times BER_{ave}) \qquad (8)$$

When the bit $x_i$ is in the areas L11:

$$P(x_i = \text{error}|XOR=1) =$$

$$(1 - (d-1) \times BER_{ave}) \times BER_{L11}/(d \times BER_{ave}) \qquad (9)$$

For example, when $P(x_i=\text{error}|XOR=1)$ is equal to or greater than ½, the bit $x_i$ is an error with a probability of 50% or more. Therefore, the control unit 11 corrects the bit by inverting the bit.

The condition that $P(x_i=\text{error}|XOR=1)$ is equal to or greater than ½ is an example of a condition about the probability that the bit $x_i$ is an error. The control unit 11 may use other conditions. For example, the condition may be that $P(x_i=\text{error}|XOR=1)$ is equal to or greater than a reference value greater than ½ (50%).

For example, a value calculated in advance can be used as the value of each BER in Equations (4) to (5) and (6) to (9). Therefore, the control unit 11 can calculate $P(x_i=\text{error}|XOR=1)$ by using the number d of the storage area where the decoding fails and the value of each BER calculated in advance.

The condition using $P(x_i=\text{error}|XOR=1)$, in other words, the condition about the probability that the bit $x_i$ is an error can be replaced with a condition about d. That is, the control unit 11 may determine the condition regarding d instead of calculating $P(x_i=\text{error}|XOR=1)$ and determining whether the condition is satisfied.

For example, the number d of storage areas where the decoding fails when $P(x_i=\text{error}|XOR=1)$ satisfies the condition can be calculated in advance. For each of the areas L01, L00, L10, and L11, values of d at which $P(x_i=\text{error}|XOR=1)$ is equal to or greater than the reference value (for example, ½) are d_L01, d_L00, d_L10, and d_L11, respectively. The control unit 11 corrects the bits of the HB data (HB) according to the following Equations (10) to (13). A symbol "^" represents the exclusive OR. When the condition on the right side is satisfied, the value of the HB is inverted.

When the bit $x_i$ is in the areas L01:

$$HB\textasciicircum=((SB1,SB2)==(0,1))\&\&$$

$$(XOR==1)\&\&$$

$$(d\leq d\_L01)) \quad (10)$$

When the bit $x_i$ is in the areas L00:

$$HB\textasciicircum=((SB1,SB2)==(0,0))\&\&$$

$$(XOR==1)\&\&$$

$$(d\leq d\_L00)) \quad (11)$$

When the bit $x_i$ is in the areas L10:

$$HB\textasciicircum=((SB1,SB2)==(1,0))\&\&$$

$$(XOR==1)\&\&$$

$$(d\leq d\_L10)) \quad (12)$$

When the bit $x_i$ is in the areas L11:

$$HB\textasciicircum=((SB1,SB2)==(1,1))\&\&$$

$$(XOR==1)\&\&$$

$$(d\leq d\_L11)) \quad (13)$$

When the SB data is 1 bit, the control unit 11, for example, corrects the HB as follows. The values of d at which $P(x_i=\text{error}|XOR=1)$ is equal to or greater than the reference value (for example, ½) in the areas Δ and outside the areas Δ are d_Δ and d_Ex, respectively. The control unit 11 corrects the bit of the HB data (HB) according to the following Equations (14) and (15).

When the bit $x_i$ is in the areas Δ:

$$HB\textasciicircum=((SB)==(0))\&\&(XOR=$$

$$=1)\&\&$$

$$(d\leq d\_\Delta)) \quad (14)$$

When the bit $x_i$ is outside the areas Δ:

$$HB\textasciicircum=((SB)==(1))\&\&$$

$$(XOR==1)\&\&$$

$$(d\leq d\_Ex)) \quad (15)$$

The case where the SB data is 2 bits will be further described with reference to the example of FIG. 5. In the example of FIG. 5, among the 0th, 2nd, 8th, 12th, (k−1)-th bits at which the XOR is 1, the 0th and 12th bits are bits of the areas L01, and the 8th bit is a bit of the areas L00 (bits corresponding to circled SB data). Assuming that Equation (10) is a condition when the bit $x_i$ is in the areas L01 and the Equation (11) is a condition when the bit $x_i$ is in the areas L00 are satisfied, the control unit 11 inverts the HB data corresponding to the 0th and 8th bits from "1" to "0", and inverts the HB data corresponding to the 12th bit from "0" to "1". The example shown in FIG. 5 is a modification for the received word indicated by the index "0", whereas the same correction is performed for the other received words whose decoding fails.

After correcting the data in this way, the control unit 11 instructs the encoding/decoding unit 14 to execute the decoding again using the corrected data for the received words in the storage areas where the decoding fails.

Figure 6:
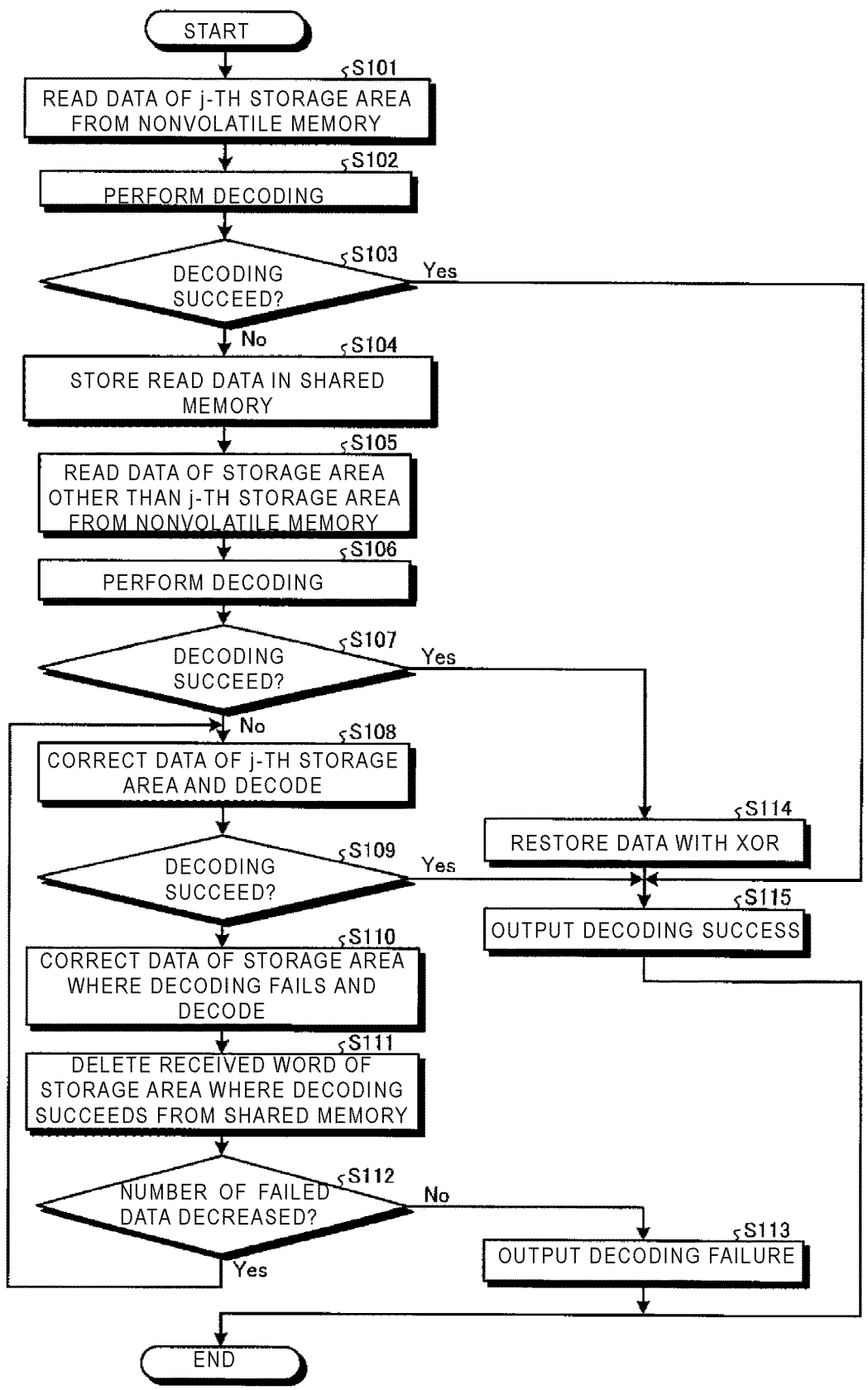
FIG. 6 is a flowchart showing an example of a decoding process.

Next, a flow of a decoding process performed by the memory system 1 according to the present embodiment configured as described above will be described. FIG. 6 is a flowchart showing an example of the decoding process in the present embodiment.

When a read request of the data in a j-th (1≤j≤N−1) storage area from the host 30 is pending, the control unit 11 instructs the memory I/F 13 to read the data (which includes user data and parity) from the nonvolatile memory 20 (step S101). For example, the control unit 11 instructs the memory I/F 13 to read the data from the j-th storage area.

The encoding/decoding unit 14 performs the decoding on the received word (which includes HB data and SB data) read from the nonvolatile memory 20 (step S102). The control unit 11 determines whether the decoding (e.g., intra-area error correction of the j-th storage area) succeeds (step S103). When the decoding succeeds (step S103: Yes), the control unit 11 outputs a decoding success (step S115), and ends the decoding process.

When the intra-area error correction in the j-th storage area fails (step S103: No), the memory I/F 13 stores the read received word in, for example, the shared memory (step S104). In addition, the control unit 11 instructs the memory I/F 13 to read the data from the (N−1) storage areas other than the j-th storage area (step S105).

The encoding/decoding unit 14 sequentially performs the decoding on the (N−1) received words (which include HB data and SB data) read from the nonvolatile memory 20 (step S106). As will be described later, the decoding may be repeatedly performed a plurality of times. Hereinafter, the number of times of decoding in step S106 is set to m (m 1). In the present embodiment, the encoding/decoding unit 14 may perform either one of the hard bit decision decoding and the soft bit decision decoding. Even in the case of hard bit decision decoding, the SB data is referred to for data correction.

The control unit 11 calculates the XOR using the decoding result for the storage areas where the intra-area error correction succeeds, and using the received word for the storage area where the intra-area error correction fails (the decoding result with the error remaining may also be used). The calculated XOR is stored in, for example, the shared memory 17. In addition, the control unit 11 also stores the data (which is the received word) whose decoding fails, for example, in the shared memory 17.

The control unit 11 determines whether the decoding of all (N−1) received words succeeds (step S107). When decoding of all the (N−1) received words other than the j-th succeeds (step S107: Yes), the data in the j-th storage area is restored using the XOR parity (step S114). After restoring the received word with the XOR parity, the control unit 11 outputs the decoding success (step S115) and ends the decoding process.

When the decoding of not all the (N−1) received words succeeds (step S107: No), that is, when the decoding of d (d≥2) received words including the j-th received word fails, the control unit 11 corrects the data in the j-th storage area using the XOR calculated in step S106 and performs the decoding again with the encoding/decoding unit (step S108). For example, when the SB data is 2 bits, the control unit 11 corrects the HB data according to Equations (10) to (13). When the SB data is 1 bit, the control unit 11 corrects the HB data according to Equations (14) and (15).

The control unit 11 determines whether the decoding (intra-area error correction of the j-th storage area) succeeds (step S109). When the decoding succeeds (step S109: Yes), the control unit 11 outputs the decoding success (step S115), and ends the decoding process. When the intra-area error correction in the j-th storage area fails again (step S109: No), for the remaining (d−1) received words recorded in the shared memory, the control unit 11 sequentially corrects the data similar as in step S108 using the XOR calculated in step S106 and performs the decoding again with the encoding/decoding unit 14 (step S110). When the decoding of the data succeeds, the control unit 11 updates the XOR calculated in step S106. For example, when the decoding of a k-th (1≤k≤d−1) received word succeeds, the control unit 11 further calculates an XOR of the k-th received word and the XOR obtained by calculating the decoded data in S106. In addition, since the k-th received word whose decoding succeeds is not decoded again, the control unit 11 may delete the received word whose decoding succeeds from the shared memory (step S111).

The control unit 11 determines whether the number of failures, which is the number of received words whose decoding fails, in an m-th decoding is decreased with respect to the number of failures in an (m−1)-th decoding (step S112). In the case of a first repetition (m=1), the control unit 11 determines that the number of failures is decreased. Determining whether the number of failures is decreased can also be interpreted as determining whether the XOR is updated in step S110.

When the number of failures does not decrease after correcting the received word and performing the decoding again, since it is unlikely that the decoding of the entire N storage areas succeeds even if the decoding is repeated, it is desirable to end the decoding as a decoding failure. Therefore, when the number of failures does not decrease (step S112: No), the control unit 11 outputs the decoding failure (step S113) and ends the decoding process.

When the number of failures is decreased, that is, when the XOR is updated in step S110 (step S112: Yes), the process returns to step S108, and the decoding is performed again using the corrected received word. In this way, it is possible to improve decoding performance by correcting the received word and repeating the decoding.

As described above, according to the present embodiment, for the received word whose decoding fails, the bit that satisfies the condition about the probability of being an error is corrected (inverted), and the intra-area error correction is performed again. Accordingly, it is possible to further improve the decoding (error correction) performance.

Second Embodiment

When the soft bit decision decoding is used as the intra-area error correction, the input soft bit decision values may be corrected. A second embodiment is an embodiment in which the soft bit decision values are corrected in this way. In the following, an example of performing the correction of the soft bit decision values in addition to the correction of the hard bit decision values will be described, whereas the soft bit decision values may be corrected without correcting the hard bit decision values.

Figure 7:
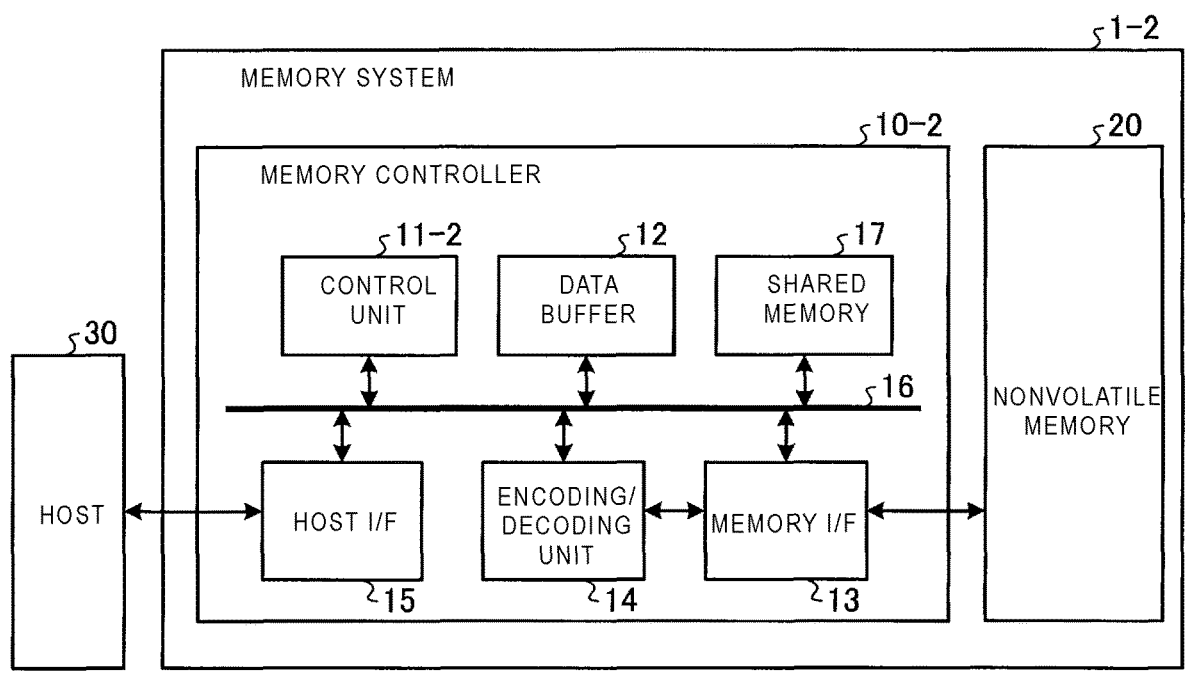
FIG. 7 is a block diagram showing a configuration example of a memory system according to a second embodiment.

FIG. 7 is a block diagram showing a configuration example of a memory system according to the second embodiment. In a memory system 1-2 of the second embodiment, a function of a control unit 11-2 in a memory controller 10-2 is different from the control unit 11 of the first embodiment. Since other functions are the same as those in the first embodiment, the same reference numerals are given and the description thereof is omitted.

The control unit 11-2 is different from the control unit 11 of the first embodiment in that the control unit 11-2 further includes a function of correcting soft bit decision values that are received words read from storage areas where the decoding fails when the decoding of two or more storage areas fails.

Figure 8:
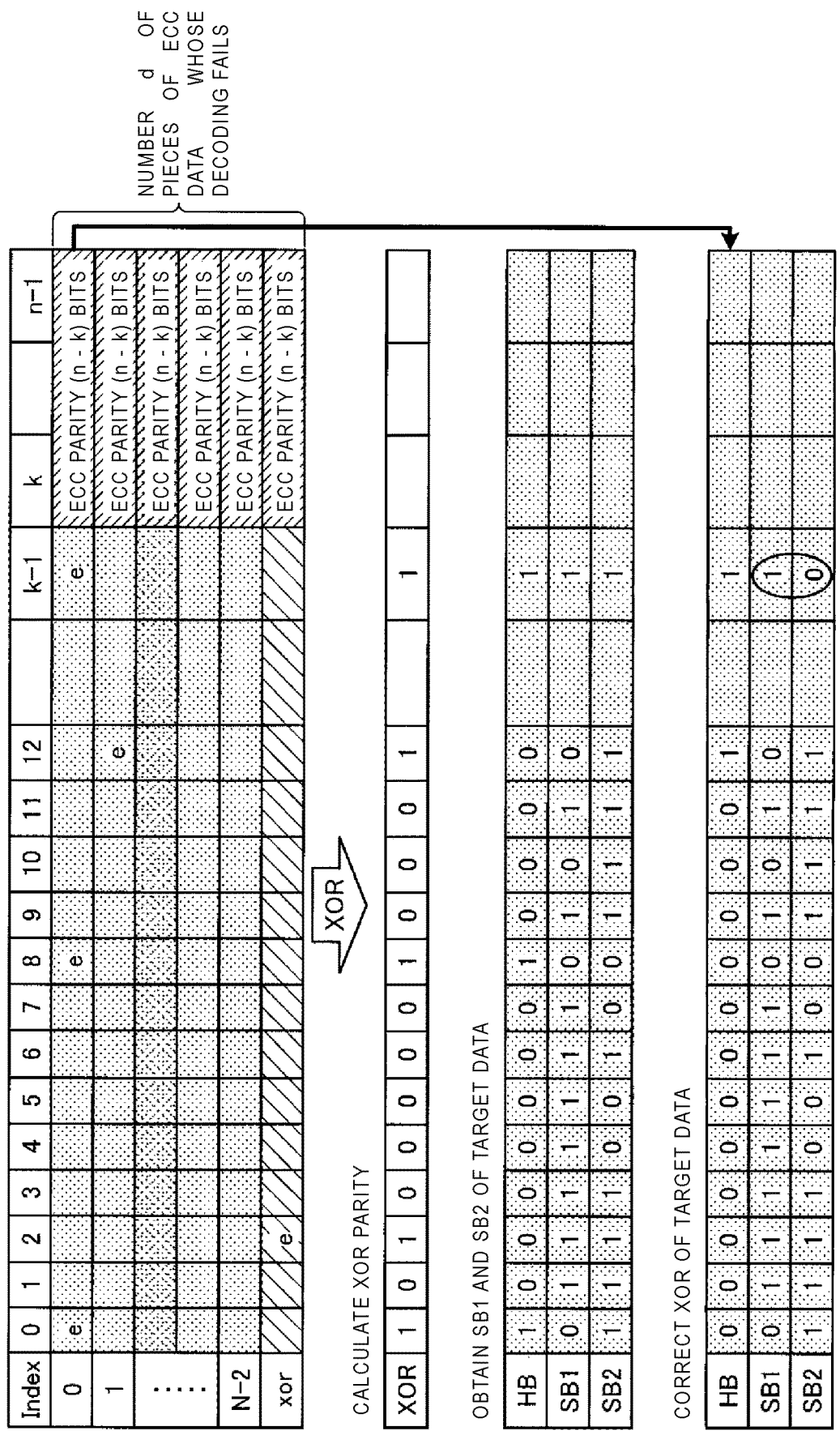
FIG. 8 is a diagram showing an example of a received word correction method according to a second embodiment.

FIG. 8 is a diagram showing an example of a received word correction method according to the present embodiment. FIG. 8 shows an example when the SB data is 2 bits (SB1, SB2), whereas the similar correction method can be applied when the SB data is 1 bit or 3 bits or more.

The control unit 11-2 corrects a bit $x_i$ included in the soft bit decision values (an example of sixth data) to a value corresponding to the probability that the bit $x_i$ is an error.

For example, the control unit 11-2 corrects the SB data (SB1, SB2) according to the following Equations (16) to (19).

$$(SB1, SB2)=(0,1) \text{ if } BER_{L01} \leq P(x_i = \text{error}|XOR=1) \quad (16)$$

$$(SB1, SB2)=(0,0) \text{ if } BER_{L00} P(x_i = \text{error}|XOR=1) <$$

$$BER_{L01} \&\& (SB1, SB2) \neq (0,1) \quad (17)$$

$$(SB1, SB2)=(1,0) \text{ if } BER_{L10} P(x_i = \text{error}|XOR=1) <$$

$$BER_{L00} \&\& (SB1, SB2) \neq (0,1) \&\& (SB1, SB2) \neq (0,0) \quad (18)$$

$$(SB1, SB2)=(1,1) \text{ if } P(x_i = \text{error } XOR=1) < BER_{L10} \quad (19)$$

For example, Equation (16) means that when the calculated probability $P(x_i = \text{error}|XOR=1)$ is equal to or greater than the $BER_{L01}$ of the areas L01 including the largest BER, the SB data is corrected to a value such that the bit $x_i$ is determined to be included in the areas L01, which is an area corresponding to the $BER_{L01}$.

An overall flow of a decoding process of the present embodiment is the same as the decoding process of FIG. 6 showing the decoding process of the first embodiment. In the present embodiment, in step S110, the control unit 11-2 corrects the HB data and corrects the SB data according to the above-described Equations (16) to (19).

FIG. 8 shows an example in which the SB data is corrected because the above-described Equation (18) is satisfied for the (k−1)-th bit among the 0, 2, 8, 12, and (k−1)-th bits.

In this way, according to the present embodiment, when the decoding fails, the soft bit decision value corresponding to the bit that satisfies the condition about the probability of being an error is corrected, and the intra-area error correction is performed again. Accordingly, it is possible to further improve the decoding (error correction) performance.

Third Embodiment

When the number of bits in an area with the lowest reliability (areas Δ, areas L01, etc.) is known, the probability $P(x_i=\text{error}|\text{XOR}=1)$ that the bit $x_i$ is an error can be calculated with higher accuracy. In the third embodiment, among the d bits in the N bits of data for calculating the XOR and corresponding to the d different storage areas where the decoding fails, the number of bits in the area with the lowest reliability is counted, and $P(x_i=\text{error}|\text{XOR}=1)$ is calculated according to the counted number.

Figure 9:
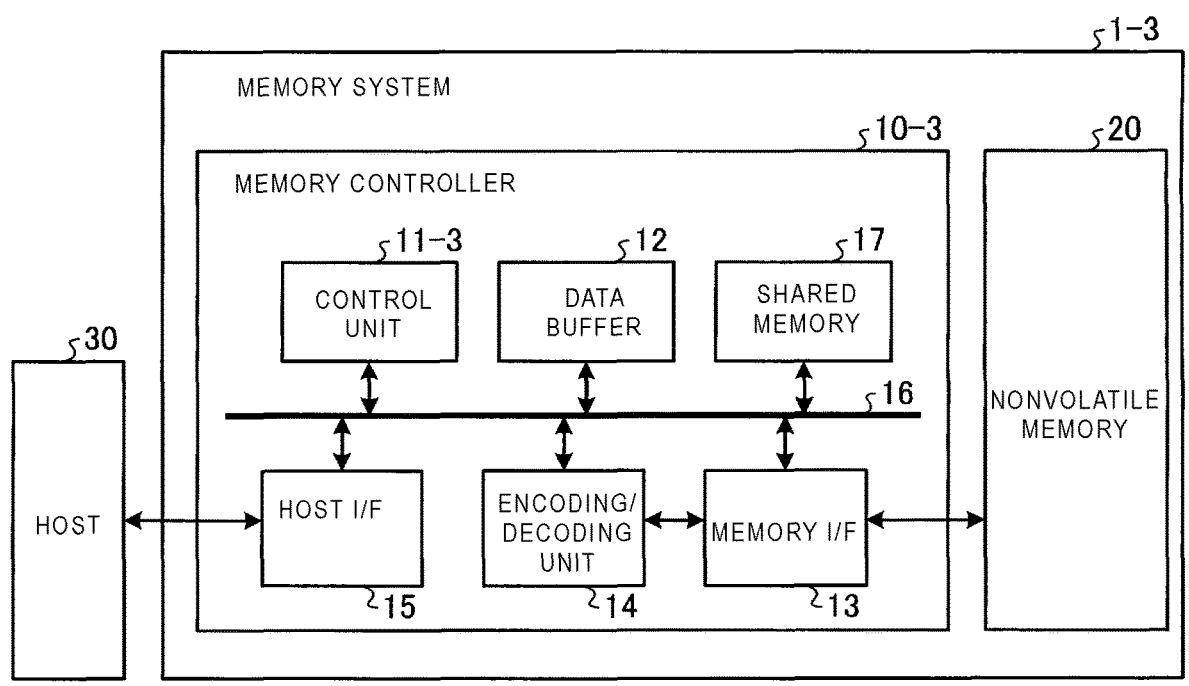
FIG. 9 is a block diagram showing a schematic configuration example of a memory system according to a third embodiment.

FIG. 9 is a block diagram showing a configuration example of a memory system according to the third embodiment. In a memory system 1-3 of the third embodiment, a function of a control unit 11-3 in a memory controller 10-3 is different from the control unit 11 of the first embodiment. Since other functions are the same as those in the first embodiment, the same reference numerals are given and the description thereof is omitted.

The control unit 11-3 is different from the control unit 11 of the first embodiment in a function of counting the number of bits in the area with the lowest reliability in the XOR codeword, and in the calculation of $P(x_i=\text{error XOR}=1)$ according to the counted number. The counted number is stored in, for example, the shared memory 17. As will be described later, it is necessary to determine whether the number is 0, 1 or others (2 or more). Therefore, for example, a storage area for storing the number of the user data size (k bit)×2 bits is secured in the shared memory 17.

Figure 10:
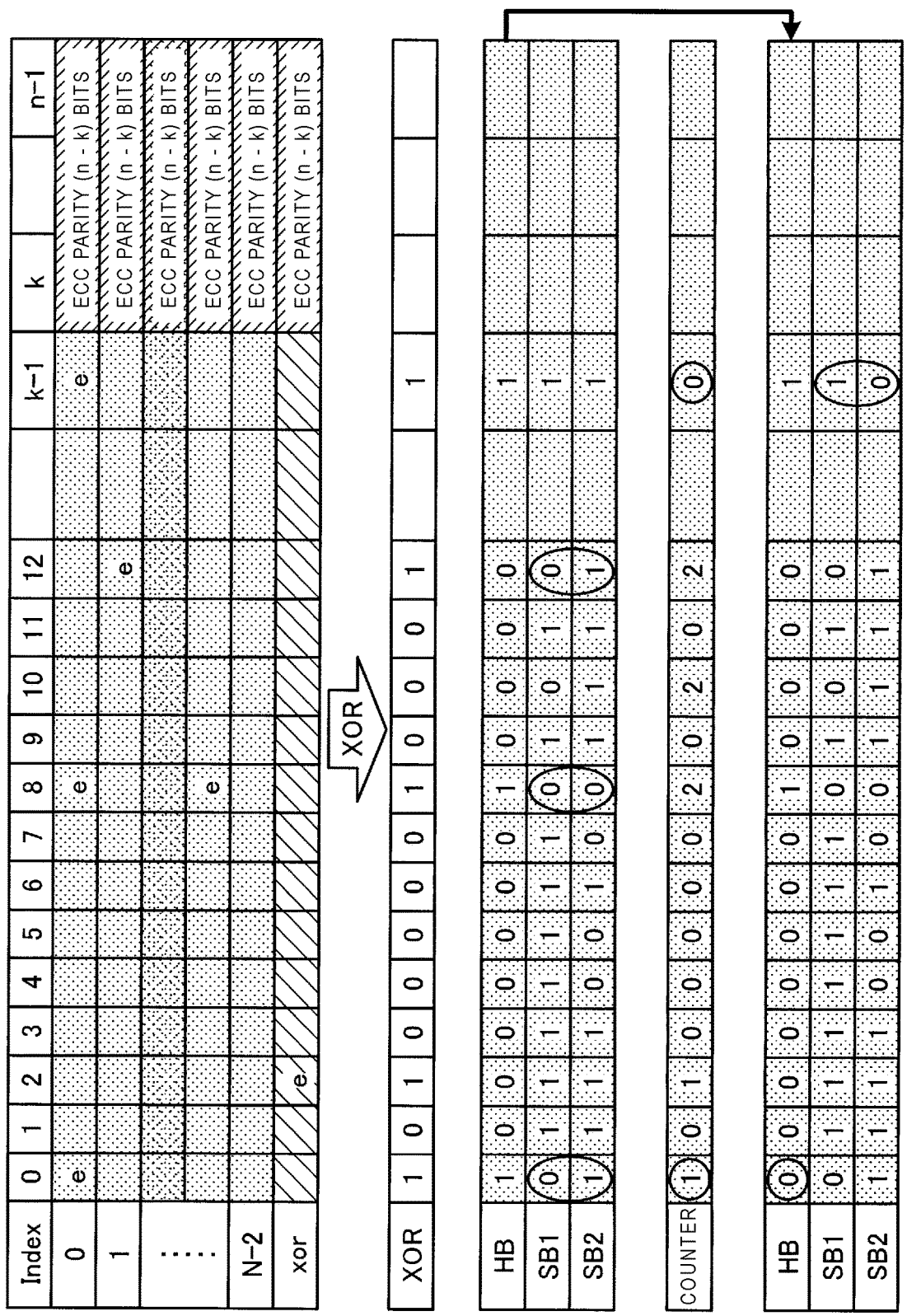
FIG. 10 is a diagram showing an example of a received word correction method according to a third embodiment.

FIG. 10 is a diagram showing an example of a received word correction method according to the present embodiment. FIG. 10 shows an example when the SB data is 2 bits (SB1, SB2), whereas the similar correction method can be applied when the SB data is 1 bit or 3 bits or more.

When calculating the XOR using the received word, the control unit 11-3 counts the number of bits in the area with the lowest reliability among the d bits corresponding to the d different storage areas where the decoding fails by a unit of XOR codeword. When the SB data is 1 bit, the control unit 11-3 counts the number of bits in the areas Δ. When the SB data is 2 bits, the control unit 11-3 counts the number of bits in the areas L01.

The control unit 11-3 calculates the probability that a bit is an error in each area using the following Equations (20) to (23).

When the bit $x_i$ is in the areas L01 and a counter is 1:

$P(x_i=\text{error}|\text{XOR}=1)=$ $(1-(d-1)\times BER_{low})\times BER_{L01}/(BER_{L01}+(d-1)\times BER_{low})$ (20)

When the bit $x_i$ is in the areas $L00$ and the counter is 0:

$P(x_i=\text{error}|\text{XOR}=1)=$ $(1-(d-1)\times BER_{low})\times BER_{L00}/(d\times BER_{low})$ (21)

When the bit $x_i$ is in the areas $L10$ and the counter is 0:

$P(x_i=\text{error}|\text{XOR}=1)=$ $(1-(d-1)\times BER_{low})\times BER_{L10}/(d\times BER_{low})$ (22)

When the bit $x_i$ is in the areas $L11$ and the counter is 0:

$P(x_i=\text{error}|\text{XOR}=1)=$ $(1-(d-1)\times BER_{low})\times BER_{L11}/(d\times BER_{low})$ (23)

For example, the bit $x_i$ being in the areas L01 and the counter being 1 means that bits other than the bit $x_i$ are not in the areas L01. Therefore, for example, the probability when the bit $x_i$ is in the areas L01 can be calculated by Equation (20) using $(d-1)\times BER_{low}$ instead of $(d-1)\times BER_{ave}$ in Equation (6).

For example, the bit $x_i$ being in the areas L00 and the counter being 0 means that no bits in the d bits are in the areas L01. Therefore, for example, the probability when the bit $x_i$ is in the areas L00 can be calculated by Equation (21) using $(d-1)\times BER_{low}$ instead of $(d-1)\times BER_{ave}$ in Equation (7).

The probability $P(x_i=\text{error}|\text{XOR}=1)$ calculated as described above can be interpreted as a value corresponding to the number of bits whose reliability is lower than other bits.

The control unit 11-3 corrects the bit of the HB data by inverting the bit of the HB data when $P(x_i=\text{error}|\text{XOR}=1)$ calculated by Equations (20) to (23) is equal to or greater than a reference value (for example, ½).

When the condition regarding d is used, the control unit 11-3 may correct the HB data as follows. For each of the areas L01, L00, L10, and L11, values of d at which $P(x_i=\text{error}|\text{XOR}=1)$ is equal to or greater than the reference value (for example, ½) are d'_L01, d'_L00, d'_L10, and d'_L11, respectively. The control unit 11-3 corrects the bit of the HB data (HB) according to the following Equations (24) to (27).

When the bit $x_i$ is in the areas L01 and a counter is 1:

$HB\hat{}=((SB1,SB2)==(0,1))\&\&$ $(\text{XOR}==1)\&\&$ $(d\leq d'\_L01)\&\&$ $(\text{counter}==1))$ (24)

When the bit $x_i$ is in the areas L00 and the counter is 0:

$HB\hat{}=((SB1,SB2)==(0,0))\&\&$ $(\text{XOR}==1)\&\&$ $(d\leq d'\_L00)\&\&$ $(\text{counter}==0))$ (25)

When the bit $x_i$ is in the areas L10 and the counter is 0:

$HB\hat{}=((SB1,SB2)==(1,0))\&\&$ $(\text{XOR}==1)\&\&$ $(d\leq d'\_L10)\&\&$ $(\text{counter}==0))$ (26)

When the bit $x_i$ is in the areas L11 and the counter is 0:

$HB\hat{}=((SB1,SB2)==(1,1))\&\&$ $(\text{XOR}==1)\&\&$ $(d\leq d'\_L11)\&\&$ $(\text{counter}==0))$ (27)

In addition, the control unit 11-3 corrects the SB data (SB1, SB2) according to the following Equations (28) to (31).

$(SB1,SB2)=(0,1)$ if $BER_{L01}\leq P(x_i=\text{error}|\text{XOR}=1)\&\&$
  $(\text{counter}=$ $=0)$ (28)

$(SB1,SB2)=(0,0)$ if $BER_{L00}\leq P(x_i=\text{error}|\text{XOR}=1)<$ $BER_{L01}\&\&(SB1,SB2)\neq(0,1)\&\&(\text{counter}==0)$ (29)

$(SB1,SB2)=(1,0)$ if $BER_{L00}\leq P(x_i=\text{error}|\text{XOR}=1)<$ $$BER_{L00} \&\&(SB1,SB2) \neq (0,1) \&\&(SB1,SB2) \neq (0,0)\&\&$$
(counter=

=0)                    (30)

$(SB1,SB2)=(1,1)$ if $P(x_i=\text{error}|XOR=1)<BER_{L00}$

&&(counter==0)         (31)

An overall flow of a decoding process of the present embodiment is the same as the decoding process of FIG. 6 showing the decoding process of the first embodiment. When calculating the XOR using the received word in (step S101) and (step S104), the control unit 11-3 counts the number of bits in the area with the lowest reliability among the d bits corresponding to the d different storage areas where the decoding fails by a unit of XOR codeword. In the present embodiment, in step S110, the control unit 11-3 corrects the HB data according to the above-described Equations (24) to (27), and corrects the SB data according to the above-described Equations (28) to (31). Herein, for example, when the decoding of the k-th received word succeeds, for ones whose counter value is equal to or less than 2, the counted number of bits in which the k-th received word is included in the areas Δ is subtracted.

FIG. 10 shows an example in which the HB data is corrected (inverted) because the above-described Equation (24) is satisfied for the 0th bit among the 0, 2, 8, 12, and (k−1)-th bits. Since the counter is 2, the 8th and 12th bits do not correspond to any of the above-described Equations, and the HB data is not corrected. In addition, the SB data is corrected because the above-described Equation (30) is satisfied for the (k−1)-th bit among the 0, 2, 8, 12, and (k−1)-th bits.

In this way, according to the present embodiment, the data is corrected using the probability corresponding to the number of bits in the area with the lowest reliability. Accordingly, it is possible to further improve the decoding (error correction) performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory, and
a memory controller configured to:
encode first XOR data generated by performing an exclusive OR operation on a plurality of pieces of user data in bit units, wherein a value of each bit of the XOR data is generated by performing an exclusive OR operation on values of bits that are at one of a plurality of bit positions of a piece of user data, generate codewords by encoding the plurality of pieces of user data and the generated XOR data, respectively, and store the plurality of codewords in the nonvolatile memory; and
perform a read operation by reading the plurality of codewords from the nonvolatile memory as a plurality of received words and decoding the received words, wherein:
when the decoding of two or more of the received words fails, the memory controller generates second XOR data, wherein a value of each bit of the second XOR data is an exclusive OR of values of bits of decoded codewords, which were successfully decoded from the received words, and received words, which were not successfully decoded into decoded codewords, at one of a plurality of bit positions of the decoded codeword or the received word; and
when a value of a bit of the second XOR data indicates a probability of an error in one of the values of the bits from which the value of the bit was generated, the memory controller corrects the value of one of the bits corresponding to one of the received words whose decoding failed, and decodes the received word that has been corrected.

2. The memory system according to claim 1, wherein
each of the plurality of pieces of fourth data, which are received words whose decoding fails, includes a hard bit decision value, and
the memory controller is configured to, for sixth data which is at the position which the second XOR data indicates a probability of an error in the fourth data:
calculate a posterior probability using the number of the failed codewords which is two or more, a prior probability that the sixth data is an error, and an average BER of the fourth data; and
when the posterior probability that the sixth data is an error is equal to or greater than a reference value is satisfied, invert the hard bit decision value included in the piece of fourth data corresponding to the sixth data, and decode the piece of fourth data corresponding to the sixth data using the inverted hard bit decision value.

3. The memory system according to claim 2, wherein
the posterior probability that the sixth data is an error varies depending on a number of the bits whose reliability is lower than a threshold value in the bits at the same position in the fourth data.

4. The memory system according to claim 2, wherein the reference value is 50%.

5. The memory system according to claim 1, wherein
each of the plurality of pieces of fourth data, which are received words whose decoding fails, includes a soft bit decision value, and
the memory controller is configured to, for sixth data which is at the position which the second XOR data indicates a probability of an error in the fourth data:
calculate a posterior probability using the number of the failed codewords which is two or more, a prior probability that the sixth data is an error, and an average BER of the fourth data, and
when the posterior probability that the sixth data is an error is equal to or greater than a reference value is satisfied, correct the soft bit decision value included in the piece of fourth data corresponding to the sixth data such that the soft bit decision value of the sixth data indicates the posterior probability that the sixth data is an error, and decode the received word including the piece of fourth data corresponding to the sixth data using the corrected soft bit decision value.

6. The memory system according to claim 1, wherein the memory controller is configured to:

when decoding of one of the received words corresponding to the user data fails, restore the received word whose decoding fails by performing an exclusive OR operation on the received words corresponding to the user data whose decoding succeeded and the first XOR data.

* * * * *